United States Patent
Yamazaki et al.

(10) Patent No.: US 9,513,557 B2
(45) Date of Patent: Dec. 6, 2016

(54) METHOD FOR MANUFACTURING REFLECTIVE MASK AND APPARATUS FOR MANUFACTURING REFLECTIVE MASK

(71) Applicant: Shibaura Mechatronics Corporation, Yokohama-shi, Kanagawa-ken (JP)

(72) Inventors: Katsuhiro Yamazaki, Kanagawa-ken (JP); Kensuke Demura, Kanagawa-ken (JP)

(73) Assignee: SHIBAURA MECHATRONICS CORPORATION, Yokohama-Shi (JP)

( * ) Notice: Subject to any disclaimer, the term of this patent is extended or adjusted under 35 U.S.C. 154(b) by 115 days.

(21) Appl. No.: 14/635,183

(22) Filed: Mar. 2, 2015

(65) Prior Publication Data

US 2015/0177624 A1    Jun. 25, 2015

Related U.S. Application Data

(62) Division of application No. 13/850,515, filed on Mar. 26, 2013, now Pat. No. 8,999,612.

(30) Foreign Application Priority Data

Mar. 28, 2012 (JP) .................................. 2012-074905
May 17, 2012 (JP) .................................. 2012-113788

(51) Int. Cl.
G03F 7/20 (2006.01)
G03F 1/24 (2012.01)

(52) U.S. Cl.
CPC ............. *G03F 7/70033* (2013.01); *G03F 1/24* (2013.01)

(58) Field of Classification Search
CPC ..................................... G03F 1/24; G03F 7/20
USPC .............................................................. 430/5
See application file for complete search history.

(56) References Cited

U.S. PATENT DOCUMENTS

2004/0211517 A1* 10/2004 Annapragada .......... C03C 15/00
156/345.47
2005/0287447 A1    12/2005 Kamm

FOREIGN PATENT DOCUMENTS

JP    2011-181657 A    9/2011
JP    2011-222612 A    11/2011

* cited by examiner

*Primary Examiner* — Stephen Rosasco
(74) *Attorney, Agent, or Firm* — Pearne & Gordon LLP

(57) ABSTRACT

According to one embodiment, a method for manufacturing a reflective mask includes: forming a reflection layer on a major surface of a substrate; forming a capping layer containing ruthenium on the reflection layer; forming an absorption layer on the capping layer; forming a pattern region in the absorption layer; removing a first resist mask used in forming the pattern region; and forming a light blocking region surrounding the pattern region in the absorption layer, the capping layer, and the reflection layer. The removing the first resist mask used in forming the pattern region includes: performing dry ashing processing using a mixed gas of ammonia gas and nitrogen gas or only ammonia gas.

9 Claims, 5 Drawing Sheets

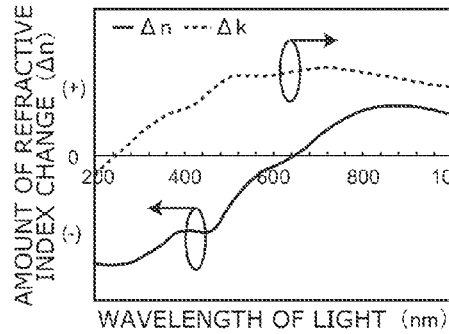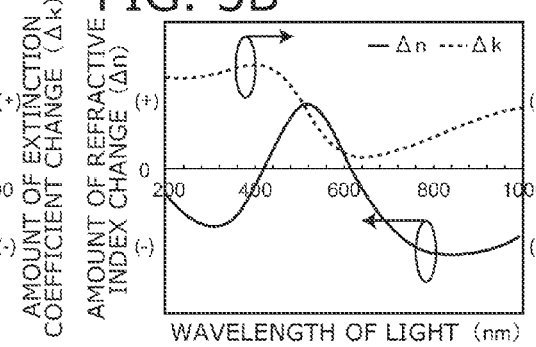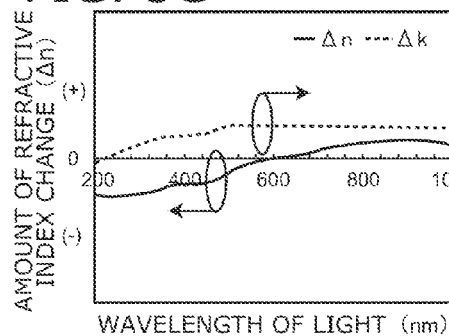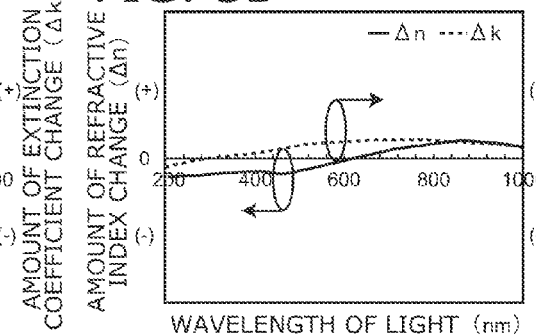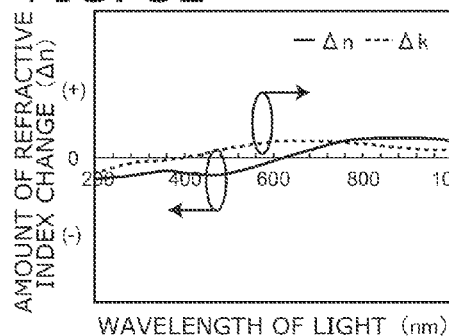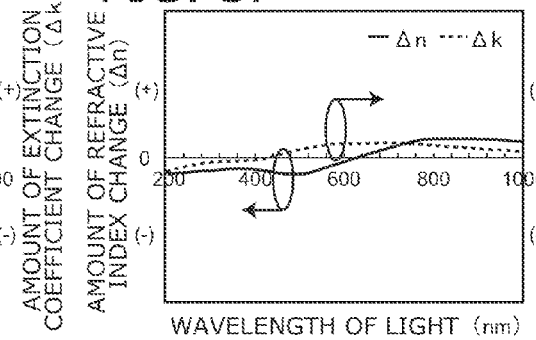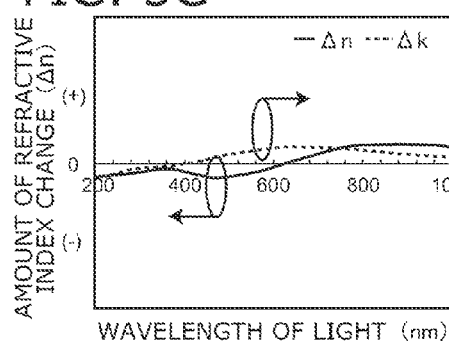

METHOD FOR MANUFACTURING REFLECTIVE MASK AND APPARATUS FOR MANUFACTURING REFLECTIVE MASK

CROSS-REFERENCE TO RELATED APPLICATIONS

This application is based upon and claims the benefit of priority from the prior Japanese Patent Applications No. 2012-074905, filed on Mar. 28, 2012, and No. 2012-113788, filed on May 17, 2012; the entire contents of which are incorporated herein by reference.

FIELD

Embodiments described herein relate generally to a method for manufacturing reflective mask and an apparatus for manufacturing reflective mask.

BACKGROUND

An EUV lithography method using extreme ultraviolet (EUV) to perform the transfer of microscopic patterns is proposed.

In the manufacturing of a reflective mask used for the EUV lithography method, a reflection layer, a capping layer (also called a stopper layer etc.), and an absorption layer are sequentially formed on the major surface of a substrate, and the absorption layer is processed by dry etching; thereby, a pattern region including a desired pattern is formed. Then, the absorption layer, the capping layer, and the reflection layer are processed by dry etching to form a light blocking region (also called a light blocking frame etc.) surrounding the pattern region.

Here, in the manufacturing of the reflective mask, the resist mask used in the dry etching processing of the absorption layer is removed by dry ashing processing using oxygen plasma or we ashing processing using sulfuric acid (e.g. see Patent Documents 1 and 2).

However, if such ashing processing is performed in the case where the capping layer is formed of ruthenium (Ru), there is a problem that the optical characteristics of the capping layer may be changed.

BRIEF DESCRIPTION OF THE DRAWINGS

FIGS. 5A to 5G are graphs for illustrating a wavelength dependence of a change in a refractive index and a change in an extinction coefficient of a film of ruthenium (Ru) before and after dry ashing processing.

DETAILED DESCRIPTION

Figure 1:
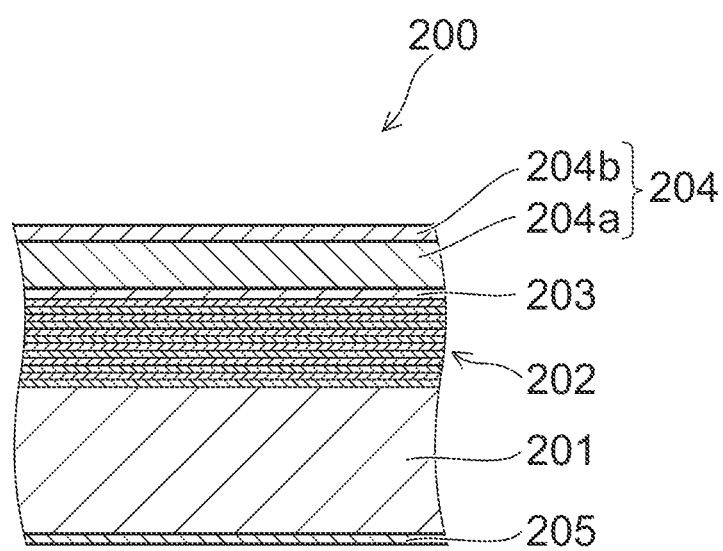
FIG. 1 is a schematic cross-sectional view for illustrating a mask blank.

In general, according to one embodiment, a method for manufacturing a reflective mask includes: forming a reflection layer on a major surface of a substrate; forming a capping layer containing ruthenium on the reflection layer; forming an absorption layer on the capping layer; forming a pattern region in the absorption layer; removing a first resist mask used in forming the pattern region; and forming a light blocking region surrounding the pattern region in the absorption layer, the capping layer, and the reflection layer. The removing the first resist mask used in forming the pattern region includes: performing dry ashing processing using a mixed gas of ammonia gas and nitrogen gas or only ammonia gas.

In general, according to another embodiment, an apparatus for manufacturing a reflective mask configured to remove a first resist mask used in forming a pattern region in a mask blank including a reflection layer, a capping layer provided on the reflection layer and containing ruthenium, and an absorption layer provided on the capping layer is provided. The apparatus includes: a processing chamber; a supply unit configured to supply gas into the processing chamber; an exhaust unit configured to exhaust an interior of the processing chamber; and a plasma generation unit configured to generate plasma in the processing chamber. The supply unit is operable to supply ammonia gas and nitrogen gas or only ammonia gas in removing a first resist mask used in forming the pattern region in the processing chamber.

Hereinbelow, embodiments are illustrated with reference to the drawings. In the drawings, like components are marked with the same reference numerals, and a detailed description is omitted as appropriate.

First Embodiment

First, a method for manufacturing a reflective mask according to a first embodiment is illustrated.

In the following, a "mixed gas" includes not only a mixture of a plurality of gases that are mixed before introduced into an environment for performing processing, but also a mixture of a plurality of gases that are introduced into an environment for performing processing and mixed in the environment.

(Manufacturing of a Mask Blank)

FIG. 1 is a schematic cross-sectional view for illustrating a mask blank 200.

First, a mask blank 200 used for manufacturing a reflective mask 210 (see FIG. 2H) is manufactured.

As shown in FIG. 1, a reflection layer 202, a capping layer 203, and an absorption layer 204 are formed on one major surface of a substrate 201 provided in the mask blank 200 so as to be stacked in this order. A conductive layer 205 is formed on the other major surface of the substrate 201.

The substrate 201 is formed of a transparent material. The substrate 201 may be formed of, for example, a low thermal expansion material (LTEM), quartz, or the like. The reflection layer 202 is formed in order to reflect extreme ultraviolet that is exposure light. The reflection layer 202 may be formed to have a configuration in which molybdenum (Mo) layers and silicon (Si) layers are alternately stacked. The reflection layer 202 may have a configuration in which approximately 40 to 50 sets of a molybdenum (Mo) layer and a silicon (Si) layer are stacked.

The capping layer 203 is formed in order to protect the reflection layer 202. The capping layer 203 may contain, for example, ruthenium (Ru). In this case, the capping layer 203 may be formed of ruthenium (Ru).

The absorption layer 204 is formed in order to suppress the reflection of extreme ultraviolet that is exposure light.

The absorption layer 204 includes an absorber layer 204a and an anti-reflection layer 204b.

The absorber layer 204a absorbs extreme ultraviolet that is exposure light. The absorber layer 204a may contain, for example, a nitride of tantalum (e.g., tantalum boron nitride (TaBN), tantalum nitride (TaN), etc.), a nitride of chromium (e.g., chromium nitride (CrN) etc.), or the like.

The anti-reflection layer 204b functions as an anti-reflection layer (AR layer) for inspection light of a wavelength around 250 nm. The anti-reflection layer 204b may contain, for example, an oxide of tantalum (e.g., tantalum boron oxide (TaBO), tantalum oxide (TaO), etc.), an oxide of chromium (e.g., chromium oxide ($CrO_x$) etc.), or the like.

The conductive layer 205 is formed in order that the reflective mask can be held by an electrostatic chuck. The conductive layer 205 may contain, for example, chromium nitride (CrN) or the like.

Known film-formation methods such as the sputtering method may be used for the formation of the reflection layer 202, the capping layer 203, the absorption layer 204, and the conductive layer 205.

For example, the manufacturing of the mask blank 200 may include forming the reflection layer 202 on a major surface of the substrate 201, forming the capping layer 203 containing ruthenium (Ru) on the reflection layer 202, and forming the absorption layer 204 on the capping layer 203.

For example, the sputtering method or the like may be used to form the reflection layer 202 having a total thickness of approximately 280 nm, form the capping layer 203 having a thickness of approximately 10 nm, form the absorption layer 204 having a total thickness of approximately 70 nm, and form the conductive layer 205 having a thickness of approximately 10 nm. However, the thicknesses of the layers are not limited to those illustrated, but may be altered as appropriate. Known technology may be applied to the film-formation conditions etc. in the case of using the sputtering method, and details of the film-formation conditions etc. are therefore omitted.

(Manufacturing of the Reflective Mask)

Next, the reflective mask 210 is manufactured from the mask blank 200 thus manufactured.

Herein, as an example, the case is illustrated where the substrate 201 is formed of a low thermal expansion material (LTEM), the reflection layer 202 includes a molybdenum (Mo) layer and a silicon (Si) layer, the capping layer 203 is formed of ruthenium (Ru), the absorber layer 204a is formed of tantalum boron nitride (TaBN), and the anti-reflection layer 204b is formed of tantalum boron oxide (TaBO).

Figure 2A:
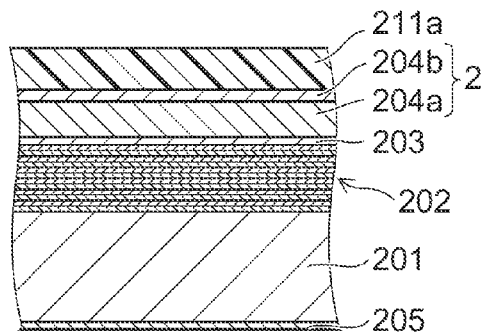
FIGS. 2A to 2H are schematic process cross-sectional views for illustrating a method for manufacturing a reflective mask according to a first embodiment.
Figure 2E:
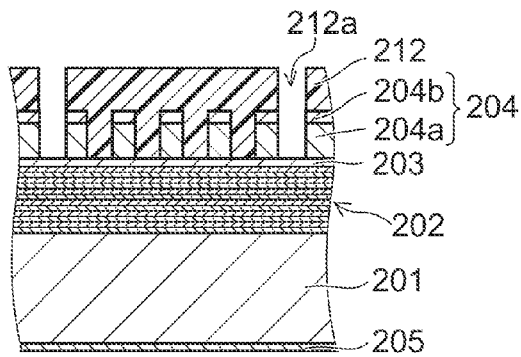
Figure 2B:
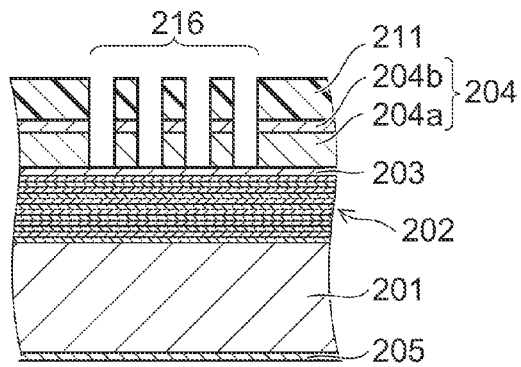
Figure 2F:
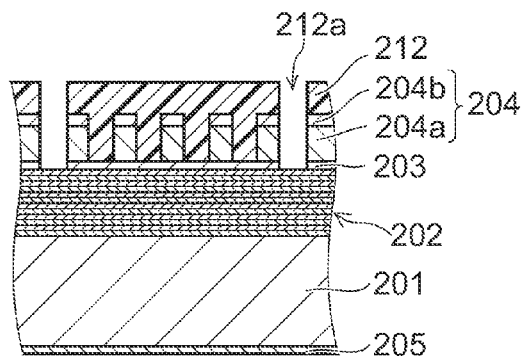
Figure 2C:
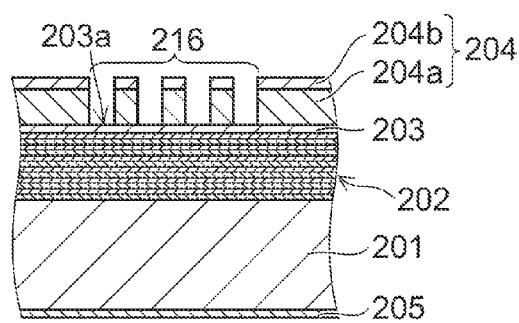

FIGS. 2A to 2H are schematic process cross-sectional views for illustrating a method for manufacturing a reflective mask according to the first embodiment. FIGS. 2A to 2C are schematic process cross-sectional views for illustrating the formation of a pattern region, and FIGS. 2D to 2H are schematic process cross-sectional views for illustrating the formation of a light blocking region.

(Formation of the Patter Region)

First, the formation of a pattern region 216 is illustrated.

As shown in FIG. 2A, an EB resist (a resist for electron beam direct drawing) 211a is applied onto the anti-reflection layer 204b. Then, an electron beam drawing apparatus is used to draw a desired pattern (e.g., a circuit pattern etc.), and post exposure bake (PEB), development, etc. are performed; thereby, a resist mask 211 (corresponding to an example of a first resist mask) having a desired resist pattern is formed.

Next, as shown in FIG. 2B, the anti-reflection layer 204b and the absorber layer 204a are sequentially processed by dry etching.

The dry etching processing of the anti-reflection layer 204b formed of tantalum boron oxide (TaBO) may be, for example, dry etching processing using a fluorine-containing gas (e.g., $CF_4$, $SF_6$, $CHF_3$, etc.).

The dry etching processing of the absorber layer 204a formed of tantalum boron nitride (TaBN) may be, for example, dry etching processing using a chlorine-containing gas (e.g., $Cl_2$, $BCl_3$, etc.).

Next, as shown in FIG. 2C, the resist mask 211 is removed.

At this time, if dry ashing processing using an oxygen-containing gas (e.g., plasma ashing processing using oxygen plasma etc.) is performed or we ashing processing using a chemical liquid such as sulfuric acid is performed in the case where the capping layer 203 is formed of ruthenium (Ru), the surface 203a of the capping layer 203 exposed in the pattern region 216 may experience an incident such as being removed, and the optical characteristics of the capping layer 203 may be changed. That is, while the resist mask 211 is removed, the surface 203a of the capping layer 203 exposed in the pattern region 216 is exposed to oxygen radicals or a chemical liquid such as sulfuric acid, and therefore the surface 203a of the capping layer 203 may experience an incident such as being removed to change the optical characteristics of the capping layer 203.

According to the findings obtained by the inventors, it has been found that the optical characteristics of the capping layer 203 may be changed even in the case of performing dry ashing processing using a gas containing no oxygen such as, for example, nitrogen gas, hydrogen gas, and a mixed gas of nitrogen gas and hydrogen gas.

Figure 3:
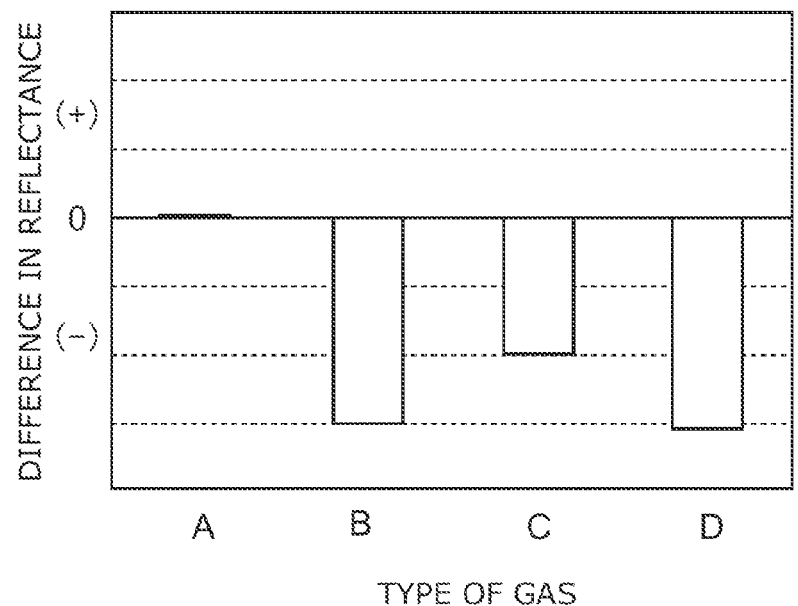
FIG. 3 is a graph for illustrating the relationship between a type of gas used for dry ashing processing and a change in optical characteristics of a capping layer.

FIG. 3 is a graph for illustrating the relationship between the type of gas used for dry ashing processing and the change in the optical characteristics of the capping layer 203.

For the type of gas in FIG. 3, A is a mixed gas of ammonia gas ($NH_3$) and nitrogen gas, B is nitrogen gas, C is a mixed gas of nitrogen gas and hydrogen gas, and D is oxygen gas.

The difference in reflectance is the difference between the reflectance of the capping layer 203 before dry ashing processing and the reflectance of the capping layer 203 after dry ashing processing. The reflectance is the reflectance of the capping layer 203 for light of a wavelength of 13.6 nm.

In FIG. 3, the region where the difference in reflectance is (+) shows that the reflectance of the capping layer 203 after dry ashing processing has become higher, and the region where the difference in reflectance is (−) shows that the reflectance of the capping layer 203 after dry ashing processing has become lower. The difference in reflectance being "0" shows that there is no change in the value of reflectance between before and after dry ashing processing.

As shown by A in FIG. 3, by performing dry ashing processing using a mixed gas of ammonia gas and nitrogen gas, the difference in reflectance can be brought close to "0". That is, the change in the optical characteristics of the capping layer 203 when dry ashing processing is performed can be suppressed. In FIG. 3, rather an improvement in reflectance of the capping layer 203 can be seen after the dry ashing processing.

A in FIG. 3 is the case where the proportion of ammonia gas contained in the mixed gas of ammonia gas and nitrogen gas is 75 vol %.

Figure 4:
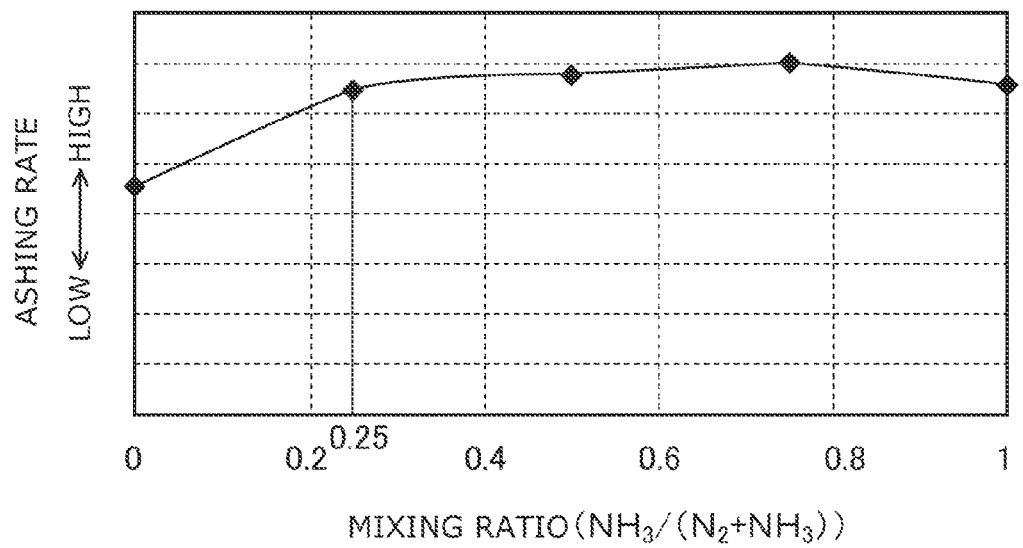
FIG. 4 is a graph for illustrating an influence of a proportion of ammonia gas contained in a mixed gas of ammonia gas and nitrogen gas on a ashing rate for a resist mask.

FIG. 4 is a graph for illustrating the influence of the proportion of ammonia gas contained in the mixed gas of ammonia gas and nitrogen gas on the ashing rate for the resist mask 211.

In FIG. 4, the proportion of ammonia gas being "0" is the case of only nitrogen gas (the case where ammonia gas is not contained), and the proportion of ammonia gas being "1" is the case of only ammonia gas (the case where nitrogen gas is not contained).

As shown in FIG. 4, when a mixed gas of ammonia gas and nitrogen gas is used and the proportion of ammonia gas contained in the mixed gas is set to 0.25 (25 vol %) or more, the ashing rate for the resist mask 211 can be improved.

Furthermore, also in the case where only ammonia gas is used, the ashing rate for the resist mask 211 can be improved.

FIGS. 5A to 5G are graphs for illustrating the wavelength dependence of the change in the refractive index and the change in the extinction coefficient of a film of ruthenium (Ru) before and after dry ashing processing.

The refractive index and the extinction coefficient were measured using the ellipsometry method.

In the measurement, a substrate made of quartz on the surface of which a film of ruthenium (Ru) with a thickness of approximately 2.5 nm was formed was used.

The refractive index n0 and the extinction coefficient k0 of the film of ruthenium (Ru) before dry ashing processing and the refractive index n1 and the extinction coefficient k1 of the film of ruthenium (Ru) after dry ashing processing were measured, and the measurement value before dry ashing processing was subtracted from the measurement value after dry ashing processing. Thereby, the amount of refractive index change $\Delta n$ ($\Delta n = n1 - n0$) and the amount of extinction coefficient change $\Delta k$ ($\Delta k = k1 - k0$) were found.

FIG. 5A is the case where dry ashing processing was performed using only nitrogen gas.

FIG. 5B is the case where dry ashing processing was performed using a mixed gas of ammonia gas and nitrogen gas in which the proportion of ammonia gas contained in the mixed gas was set to 25 vol %.

FIG. 5C is the case where dry ashing processing was performed using a mixed gas of ammonia gas and nitrogen gas in which the proportion of ammonia gas contained in the mixed gas was set to 50 vol %.

FIG. 5D is the case where dry ashing processing was performed using a mixed gas of ammonia gas and nitrogen gas in which the proportion of ammonia gas contained in the mixed gas was set to 60 vol %.

FIG. 5E is the case where dry ashing processing was performed using a mixed gas of ammonia gas and nitrogen gas in which the proportion of ammonia gas contained in the mixed gas was set to 75 vol %.

FIG. 5F is the case where dry ashing processing was performed using a mixed gas of ammonia gas and nitrogen gas in which the proportion of ammonia gas contained in the mixed gas was set to 80 vol %.

FIG. 5G is the case where dry ashing processing was performed using only ammonia gas.

As can be seen from FIGS. 5A to 5G, in the case where a mixed gas of ammonia gas and nitrogen gas is used in dry ashing processing, the amount of refractive index change $\Delta n$ and the amount of extinction coefficient change $\Delta k$ can be made small by setting the proportion of ammonia gas contained in the mixed gas to 50 vol % or more.

Furthermore, also in the case where only ammonia gas is used in dry ashing processing, the amount of refractive index change $\Delta n$ and the amount of extinction coefficient change $\Delta k$ can be made small.

This means that the change in the optical characteristics of the capping layer 203 containing ruthenium (Ru) can be suppressed by, in dry ashing processing, using a mixed gas of ammonia gas and nitrogen gas and setting the proportion of ammonia gas contained in the mixed gas to 50 vol % or more, or using only ammonia gas.

Thus, in the method for manufacturing a reflective mask according to the embodiment, dry ashing processing using a mixed gas of ammonia gas and nitrogen gas or only ammonia gas is performed in the process of removing the resist mask 211 used in forming the pattern region 216.

In the case of performing dry ashing processing using a mixed gas of ammonia gas and nitrogen gas, the proportion of ammonia gas contained in the mixed gas of ammonia gas and nitrogen gas is set to 0.5 (50 vol %) or more.

By the above, the change in the optical characteristics of the capping layer 203 containing ruthenium (Ru) can be suppressed, and the ashing rate for the resist mask 211 can be improved.

Thus, the pattern region 216 is formed.
(Formation of the Light Blocking Region)

Next, returning to FIG. 2D, the formation of a light blocking region 217 is illustrated.

The light blocking region 217 is a frame-like region formed so as to surround the pattern region 216, and is formed in order to prevent exposure light from coming out to an adjacent region when the pattern is transferred.

Figure 2G:
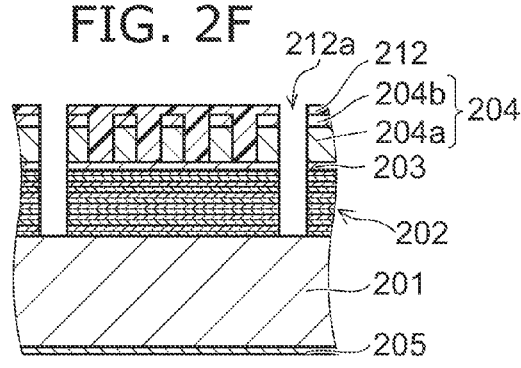
Figure 2D:
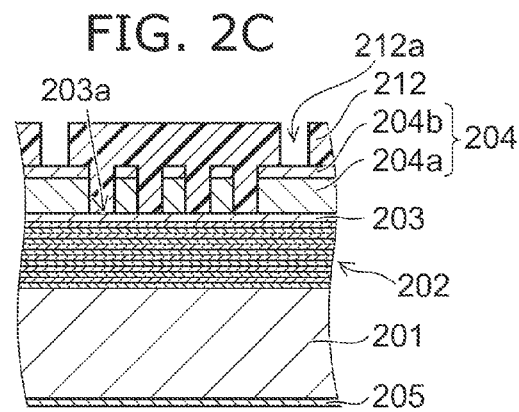

First, as shown in FIG. 2D, a resist is applied onto the absorption layer 204 and onto the exposed surface 203a of the capping layer 203. Then, laser light or the like is used to draw a desired pattern, and post exposure bake, development, etc. are performed; thereby, a resist mask 212 (corresponding to an example of a second resist mask) having a desired resist pattern is formed. In this case, a frame-like region 212a is patterned so as to surround the pattern region 216.

Next, as shown in FIG. 2E, the anti-reflection layer 204b and the absorber layer 204a are sequentially processed by dry etching. The dry etching processing is performed until the surface of the capping layer 203 becomes exposed.

The dry etching processing of the anti-reflection layer 204b and the absorber layer 204a may be similar to that illustrated in FIG. 2B.

It is also possible to perform dry etching processing on the absorber layer 204a and the anti-reflection layer 204b in the light blocking region 217 simultaneously in the formation of the pattern region 216.

Next, as shown in FIG. 2F, the capping layer 203 is processed by dry etching. The dry etching processing of the capping layer 203 formed of ruthenium (Ru) may be, for example, dry etching processing using a mixed gas of a chlorine-containing gas and oxygen gas.

As the chlorine-containing gas, for example, $Cl_2$, $CCl_4$, HCl, and the like may be illustrated.

Next, as shown in FIG. 2G, the reflection layer 202 including a molybdenum (Mo) layer and a silicon (Si) layer is processed by dry etching.

In this case, a mixed gas of a chlorine-containing gas and oxygen gas is used, and the proportion of oxygen gas in the mixed gas is set not less than 5 vol % and not more than 30 vol %. Such proportions of oxygen gas can suppress the surface processed by dry etching becoming a comb teeth shape.

As the chlorine-containing gas, for example, $Cl_2$, $CCl_4$, HCl, and the like may be illustrated.

Furthermore, for example, when the total thickness of the absorption layer 204 is approximately 70 nm, the thickness of the capping layer 203 is approximately 10 nm, and the total thickness of the reflection layer 202 is approximately 280 nm, by setting the thickness of the resist mask 212 to 420 nm or more and setting the proportion of oxygen gas not less than 5 vol % and not more than 30 vol %, at least the number of times of re-formation of the resist mask 212 can be greatly reduced.

Here, there is a case where the silicon (Si) layer in the reflection layer 202 is oxidized during film-formation or is oxidized by oxygen in the gas used in etching processing, and the silicon (Si) layer is altered to a silicon oxide ($SiO_2$) layer.

Using a mixed gas of a chlorine-containing gas and oxygen gas is a gas condition whereby the selection ratio to a silicon oxide ($SiO_2$) layer is increased. Accordingly, the etching rate of the silicon oxide ($SiO_2$) layer may become very low, and the silicon oxide ($SiO_2$) layer may remain as a residue.

In such a case, a fluorine-containing gas (e.g., $CF_4$, $CHF_3$, $NF_3$, etc. and a mixed gas thereof) may be further added to the mixed gas of a chlorine-containing gas and oxygen gas; thereby, the etching rate of the silicon oxide ($SiO_2$) layer can be increased.

In the case where a fluorine-containing gas is added, molybdenum (Mo) and silicon (Si) can be removed at almost the same etching rate by adjusting the proportion of the fluorine-containing gas to the chlorine-containing gas.

Figure 2H:
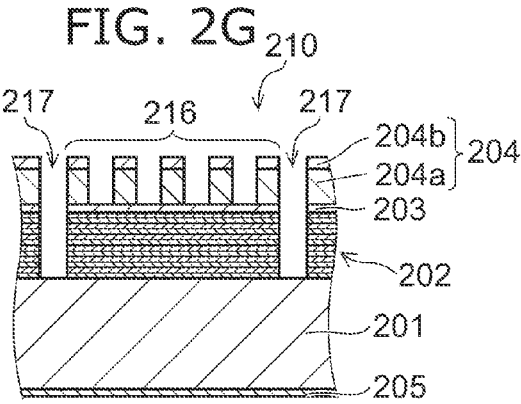

Next, as shown in FIG. 2H, the resist mask 212 is removed.

In this case, since the time in which the surface 203a of the capping layer 203 is exposed to oxygen radicals or a chemical liquid such as sulfuric acid is short as compared to the case of FIG. 2C, either dry ashing processing using an oxygen-containing gas or we ashing processing using a chemical liquid may be performed.

However, similarly to the case of FIG. 2C, when the resist mask 212 is removed, it is preferable to perform dry ashing processing using a mixed gas of ammonia gas and nitrogen gas or only ammonia gas.

When dry ashing processing using a mixed gas of ammonia gas and nitrogen gas is performed, the proportion of ammonia gas contained in the mixed gas of ammonia gas and nitrogen gas may be set to 0.5 (50 vol %) or more; thereby, the change in the optical characteristics of the capping layer 203 formed of ruthenium (Ru) can be suppressed, and the ashing rate for the resist mask 212 can be improved.

As described above, also in the case where dry ashing processing using only ammonia gas is performed, the change in the optical characteristics of the capping layer 203 formed of ruthenium (Ru) can be suppressed, and the ashing rate for the resist mask 212 can be improved.

By thus forming the light blocking region 217, the reflective mask 210 is manufactured.

Second Embodiment

Figure 6:
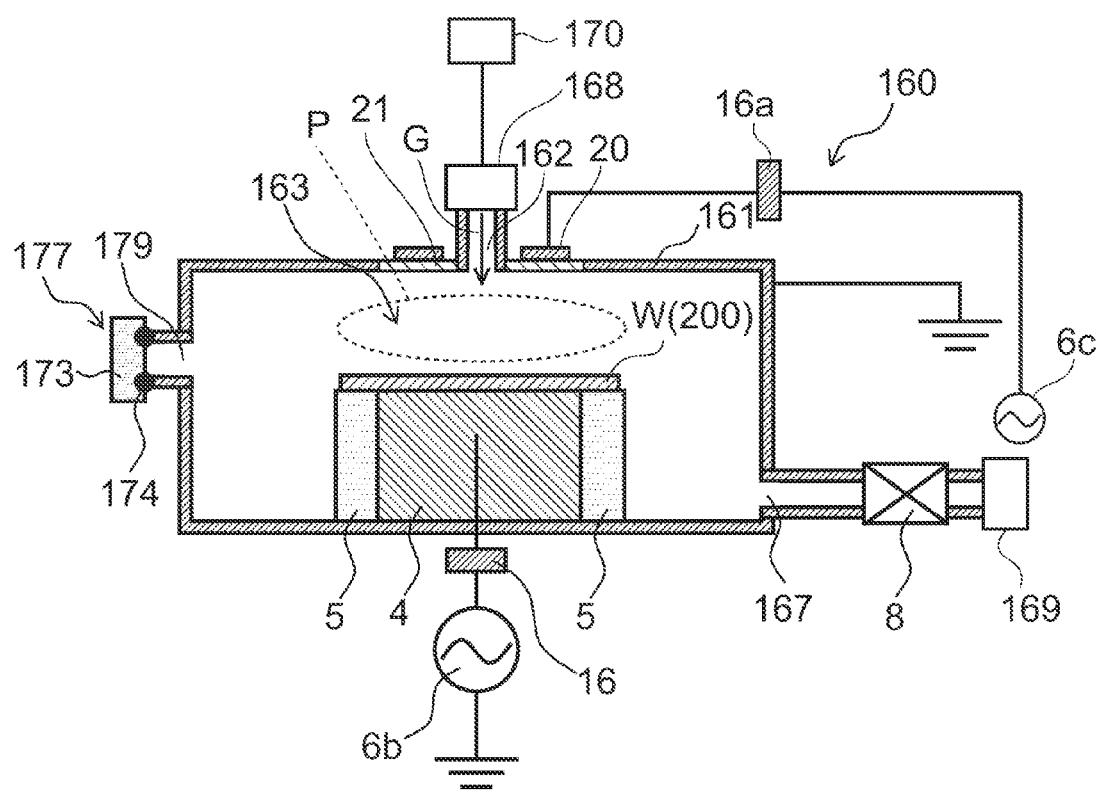
FIG. 6 is a schematic cross-sectional view for illustrating an apparatus for manufacturing a reflective mask according to a second embodiment.

FIG. 6 is a schematic cross-sectional view for illustrating an apparatus for manufacturing a reflective mask according to a second embodiment.

The apparatus for manufacturing a reflective mask illustrated in FIG. 6 is a two-frequency plasma processing apparatus.

As shown in FIG. 6, a manufacturing apparatus 160 includes a processing chamber 161, a gate valve 177 that closes a carry-in/out port 179 provided at the processing chamber 161, a supply unit 168 that selectively supplies a plurality of processing gases G into the processing chamber 161, an exhaust unit 169 that exhausts the interior of the processing chamber 161, etc.

The processing chamber 161 is formed of an electrically conductive material such as aluminum, and can maintain a reduced-pressure atmosphere. A processing gas introduction port 162 for introducing the processing gas G is provided in a central portion of the ceiling of the processing chamber 161.

The processing gas G is supplied from the supply unit 168 into the processing chamber 161 via the processing gas introduction port 162. When the processing gas G is supplied into the processing chamber 161, the flow rate, pressure, etc. of the processing gas G are adjusted by a not-shown processing gas adjustment unit.

A not-shown switching unit is provided in the supply unit 168 so that the type of the processing gas G supplied into the processing chamber 161 can be switched. For example, when the reflection layer 202, the capping layer 203, the absorber layer 204a, and the anti-reflection layer 204b described above are processed by dry etching, processing gases G suitable for the respective dry etching processings can be supplied. When the resist mask 211 and the resist mask 212 are processed by dry ashing, processing gases G suitable for the respective dry ashing processings can be supplied.

A supply control unit 170 that controls the not-shown processing gas adjustment unit and the not-shown switching unit is provided.

Therefore, the adjustment of the flow rate and pressure of the processing gas G described above and the switching of the type of the processing gas G can be made by controlling the not-shown processing gas adjustment unit and the not-shown switching unit with the supply control unit 170.

In this case, also the component ratio of a mixed gas can be controlled by controlling the switching of the type of the processing gas G and the flow rate of the processing gas G with the supply control unit 170.

A dielectric window 21 made of a dielectric material (e.g., quartz etc.) is provided in a portion of the ceiling of the processing chamber 161 on the outside of the diameter of the processing gas introduction port 162. A coil 20 made of an electric conductor is provided on the surface of the dielectric window 21. One end of the coil 20 is grounded (not shown), and the other end is connected to a high-frequency power source 6c via a matching box 16a.

A processing space 163 that is a space for processing an object to be processed W is provided in the processing chamber 161. The object to be processed W may be, for example, the mask blank 200 described above.

An electrode unit 4 is provided below the processing space 163. A high-frequency power source 6b is connected to the electrode unit 4 via a matching box 16. The processing chamber 161 is grounded.

The manufacturing apparatus 160 is a two-frequency plasma processing apparatus that includes an inductively coupled electrode in an upper portion and a capacitively coupled electrode in a lower portion. That is, the electrode unit 4 and the processing chamber 161 constitute a capacitively coupled electrode, and the coil 20 forms an inductively coupled electrode.

The high-frequency power source 6b may be one that applies a high-frequency electric power of approximately 1 KW having a frequency of approximately 100 KHz to 100 MHz to the electrode unit 4.

The high-frequency power source 6c may be one that applies a high-frequency electric power of approximately 3 KW having a frequency of approximately 100 KHz to 100 MHz to the coil 20.

A not-shown tuning circuit is provided in the matching boxes 16 and 16a. Plasma P can be controlled by controlling reflected waves with the not-shown tuning circuits.

In the manufacturing apparatus 160, the electrode unit 4, the processing chamber 161, the high-frequency power source 6b, the high-frequency power source 6c, the coil 20, etc. constitute a plasma generation unit that generates plasma P in the processing chamber 161.

The periphery of the electrode unit 4 is covered with an insulating ring 5. The object to be processed W can be mounted on the electrode unit 4 in which a holding mechanism (not shown) for holding the object to be processed W, a delivery unit (not shown) for delivering the object to be processed W, etc. are provided.

An exhaust port 167 is provided at the bottom of the processing chamber 161, and an exhaust unit 169 such as a vacuum pump and the like is connected to the exhaust port 167 via a pressure controller 8. The exhaust unit 169 performs exhaust so that the interior of the processing chamber 161 may become a prescribed pressure. The side wall of the processing chamber 161 is provided with a carry-in/out port 179 for carrying in and out the object to be processed W, and provided with a gate valve 177 so that the carry-in/out port 179 can be closed in a gas-tight manner. The gate valve 177 includes a door 173 provided with a seal member 174 such as an O ring, and is opened and closed by a not-shown gate opening/closing mechanism. When the door 173 is closed, the seal member 174 is pressed against the wall surface of the carry-in/out port 179, and the carry-in/out port 179 is closed in a gas-tight manner.

(Working of the Apparatus for Manufacturing a Reflective Mask 160)

Next, the working of the manufacturing apparatus 160 is illustrated.

In this case, as an example, a description is given using the case where the object to be processed W is the mask blank 200 and dry etching processing and dry ashing processing are performed on the mask blank 200 to manufacture the reflective mask 210.

Furthermore, as an example, the case is illustrated where the substrate 201 is formed of a low thermal expansion material (LTEM), the reflection layer 202 includes a molybdenum (Mo) layer and a silicon (Si) layer, the capping layer 203 is formed of ruthenium (Ru), the absorber layer 204a is formed of tantalum boron nitride (TaBN), and the anti-reflection layer 204b is formed of tantalum boron oxide (TaBO).

First, the formation of the pattern region 216 described above is performed.

The door 173 of the gate valve 177 is opened by the not-shown gate opening/closing mechanism.

The mask blank 200 is carried into the processing chamber through the carry-in/out port 179 by a not-shown carrying unit. The mask blank 200 is mounted on the electrode unit 4, and held by the not-shown holding mechanism provided in the electrode unit 4.

The not-shown carrying unit is moved to the outside of the processing chamber 161.

The door 173 of the gate valve 177 is closed by the not-shown gate opening/closing mechanism.

The interior of the processing chamber 161 is exhausted by the exhaust unit 169.

Then, the dry etching processing of the anti-reflection layer 204b described above is performed.

In this case, dry etching processing using a fluorine-containing gas may be performed.

More specifically, first, a fluorine-containing gas is supplied from the supply unit 168 into the processing space 163 via the processing gas introduction port 162. The fluorine-containing gas may be, for example, $CF_4$, $CHF_3$, $NF_3$, or the like or a mixed gas thereof. The flow rate of the fluorine-containing gas may be set to approximately 60 sccm.

Next, a high-frequency electric power having a frequency of approximately 100 KHz to 100 MHz is applied to the coil 20 by the high-frequency power source 6c. Furthermore, a high-frequency electric power having a frequency of approximately 100 KHz to 100 MHz is applied to the electrode unit 4 by the high-frequency power source 6b. The frequencies of the high-frequency electric powers applied by the high-frequency power source 6c and the high-frequency power source 6b are preferably set equal. For example, the frequencies of the high-frequency electric powers applied by the high-frequency power source 6c and the high-frequency power source 6b may be set to 13.56 MHz.

The high-frequency power source 6c may apply a high-frequency electric power of approximately 3 KW, and the high-frequency power source 6b may apply a high-frequency electric power of approximately 1 KW.

Thereby, since the electrode unit 4 and the processing chamber 161 constitute a capacitively coupled electrode, a discharge occurs between the electrode unit 4 and the processing chamber 161. Furthermore, since the coil 20 forms an inductively coupled electrode, a high-frequency electric power is introduced into the processing chamber 161 from the coil 20 via the dielectric window 21. Consequently, plasma P is generated in the processing space 163 by the discharge generated between the electrode unit 4 and the processing chamber 161 and the high-frequency electric power introduced into the processing chamber 161. The generated plasma P excites and activates the fluorine-containing gas to generate reaction products such as neutral active species, ions, and electrons. The generated reaction products go down in the processing space 163 to reach the mask blank 200; thereby, dry etching processing is performed. The control of the plasma P is carried out by controlling reflected waves with the not-shown tuning circuits provided in the matching boxes 16 and 16a.

The residual fluorine-containing gas and most of the reaction products and by-products are discharged to the outside of the processing chamber 161 through the exhaust port 167.

In this dry etching processing, part of the anti-reflection layer 204b is removed using the resist mask 211 formed on the surface of the anti-reflection layer 204b. More specifically, portions of the anti-reflection layer 204b not covered with the resist mask 211 are removed.

After the dry etching processing of the anti-reflection layer 204b is finished, the interior of the processing chamber 161 is exhausted. Subsequently, dry etching processing is performed on the absorber layer 204a.

In this case, the type of the processing gas G supplied is switched by the not-shown switching unit provided in the supply unit 168. That is, a chlorine-containing gas is supplied from the supply unit 168, and dry etching processing using the chlorine-containing gas is performed. As the chlorine-containing gas, for example, $Cl_2$, $CCl_4$, HCl, or the like or a mixed gas thereof may be used. The flow rate of the chlorine-containing gas may be set to approximately 180 sccm.

Then, similarly to the case of the anti-reflection layer 204b, part of the absorber layer 204a is removed using the resist mask 211 formed on the surface of the anti-reflection layer 204b. More specifically, portions of the absorber layer 204a not covered with the resist mask 211 are removed.

Thus, the formation of the pattern region 216 is performed.

Next, in the processing chamber 161, the resist mask 211 used in forming the pattern region 216 is removed.

In this case, the type of the processing gas G supplied is switched by the not-shown switching unit provided in the supply unit 168.

As described above, part of the surface of the capping layer 203 containing ruthenium (Ru) is exposed; thus, ammonia gas and nitrogen gas or only ammonia gas is supplied from the supply unit 168, and dry ashing processing using a mixed gas of ammonia gas and nitrogen gas or only ammonia gas is performed.

At this time, in the case where a mixed gas of ammonia gas and nitrogen gas is used, the proportion of ammonia gas contained in the mixed gas is set to 0.5 (50 vol %) or more.

Working in regard to generating plasma P etc. are similar to those in the case of dry etching processing described above, and a detailed description is therefore omitted.

It is also possible to perform dry ashing processing in each of manufacturing apparatuses having a similar configuration to the manufacturing apparatus 160.

That is, a manufacturing apparatus 160 that performs dry etching processing, a manufacturing apparatus 160 that performs dry ashing processing, or a manufacturing apparatus 160 that performs dry etching processing and dry ashing processing can be provided.

In the case where dry ashing processing is performed in a manufacturing apparatus having a similar configuration to the manufacturing apparatus 160, first, a purge gas or the like is introduced through the processing gas introduction port 162 so that the pressure in the processing chamber 161 and the pressure outside the door 173 of the gate valve 177 may be almost equal.

Next, the door 173 of the gate valve 177 is opened by the not-shown gate opening/closing mechanism.

Next, the mask blank 200 with the pattern region 216 formed is carried out by the not-shown carrying unit.

Next, the mask blank 200 with the pattern region 216 formed is carried into a manufacturing apparatus having a similar configuration to the manufacturing apparatus 160, and dry ashing processing using a mixed gas of ammonia gas and nitrogen gas or only ammonia gas is performed to remove the residual resist mask 211.

Next, the formation of the light blocking region 217 described above is performed.

First, outside the processing chamber 161, a resist is applied to the anti-reflection layer 204b, the absorber layer 204a, and the exposed surface of the capping layer 203, and the drawing of a pattern, post exposure bake, development, etc. are performed; thereby, the resist mask 212 having a desired resist pattern is formed.

Next, similarly to what is described above, the mask blank 200 is carried into the processing chamber.

Then, similarly to what is described above, the anti-reflection layer 204b, the absorber layer 204a, the capping layer 203, and the reflection layer 202 are sequentially processed by dry etching.

In this case, as described above, in the dry etching processing of the reflection layer 202, a gas containing chlorine gas and oxygen gas may be used, and the proportion of oxygen gas may be set not less than 5 vol % and not more than 30 vol %. Such proportions of oxygen gas can suppress the surface processed by dry etching of the reflection layer 202 becoming a comb teeth shape.

Furthermore, for example, when the total thickness of the absorption layer 204 is approximately 70 nm, the thickness of the capping layer 203 is approximately 10 nm, the total thickness of the reflection layer 202 is approximately 280 nm, and the thickness of the resist mask 212 is 420 nm or more, the proportion of oxygen gas may be set not less than 5 vol % and not more than 30 vol %. Such proportions of oxygen gas can at least greatly reduce the number of times of re-formation of the resist mask 212.

As described above, in the case where the silicon (Si) layer is oxidized to form a silicon oxide ($SiO_2$) layer in the reflection layer 202, a fluorine-containing gas (e.g., $CF_4$, $CHF_3$, $NF_3$, etc. and a mixed gas thereof) may be further added to the gas containing chlorine and oxygen.

In this case, the proportion of $CF_4$, which is a fluorine-containing gas, to chlorine may be set not less than 5 vol % and not more than 40 vol %.

Thereby, molybdenum (Mo) and silicon (Si) can be removed at almost the same etching rate while the selection ratio to the resist is kept.

Furthermore, the etching rate of the silicon oxide ($SiO_2$) layer can be made nearly 10 times higher than in the case where dry etching processing is performed using a gas containing chlorine and oxygen. Therefore, dry etching processing in which the silicon oxide ($SiO_2$) layer is not left as a residue can be performed.

Working in regard to carrying in and out, working in regard to generating plasma P, etc. are similar to those in the case of forming the pattern region 216, and a detailed description is therefore omitted.

Next, the removal of the residual resist mask 212 is performed.

In this case, the type of the processing gas G supplied is switched by the not-shown switching unit provided in the supply unit 168. For example, as described above, since the time in which the surface 203a of the capping layer 203 is exposed to oxygen radicals is short, dry ashing processing can be performed by supplying an oxygen-containing gas.

However, it is preferable to perform dry ashing processing using a mixed gas of ammonia gas and nitrogen gas or only ammonia gas.

When dry ashing processing using a mixed gas of ammonia gas and nitrogen gas is performed, the proportion of ammonia gas contained in the mixed gas of ammonia gas and nitrogen gas may be set to 0.5 (50 vol %) or more; thereby, the change in the optical characteristics of the capping layer 203 formed of ruthenium (Ru) can be suppressed, and the ashing rate for the resist mask 212 can be improved.

As described above, also in the case where dry ashing processing using only ammonia gas is performed, the change in the optical characteristics of the capping layer 203 formed of ruthenium (Ru) can be suppressed, and the ashing rate for the resist mask 212 can be improved.

In this case, working in regard to generating plasma P etc. are similar to those in the case of dry etching processing described above, and a detailed description is therefore omitted.

Similarly to the removal of the resist mask 212 described above, it is possible not only to remove the resist mask 212 in the manufacturing apparatus 160, but also to remove the resist mask 212 in a manufacturing apparatus having a similar configuration to the manufacturing apparatus 160.

The removal of the resist mask 212 may be similar to the removal of the resist mask 211 formed from the EB resist 211a described above, and a detailed description is therefore omitted.

For example, the shape, dimensions, material, arrangement, number, etc. of the components of the manufacturing apparatus 160 are not limited to those illustrated, and may be altered as appropriate.

For example, although the manufacturing apparatus 160 that performs the removal of the resist mask 212 is described as a two-frequency plasma processing apparatus in the embodiments described above, it may be also plasma processing apparatuses of other forms such as a remote plasma processing apparatus and a surface wave plasma processing apparatus. Also in this case, similar effects to the embodiments described above can be obtained.

Furthermore, components of the embodiments described above may be combined within the extent of technical feasibility, and combinations of them also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An apparatus for manufacturing a reflective mask configured to remove a first resist mask used in forming a pattern region in a mask blank including a reflection layer, a capping layer provided on the reflection layer and containing ruthenium, and an absorption layer provided on the capping layer,
the apparatus comprising:
a processing chamber;
a supply unit configured to supply gas into the processing chamber;
an exhaust unit configured to exhaust an interior of the processing chamber; and
a plasma generation unit configured to generate plasma in the processing chamber,
the supply unit being operable to supply ammonia gas and nitrogen gas or only ammonia gas in removing a first resist mask used in forming the pattern region in the processing chamber.

2. The apparatus according to claim 1, wherein part of a surface of the capping layer containing ruthenium is exposed when a first resist mask used in forming the pattern region is removed in the processing chamber.

3. The apparatus according to claim 1, wherein a proportion of the ammonia gas in the ammonia gas and the nitrogen gas is 50 vol % or more.

4. The apparatus according to claim 1,
a proportion of the ammonia gas in the mixed gas of ammonia gas and nitrogen gas is set to 75 vol % or more.

5. The apparatus according to claim 1, wherein the absorption layer includes an absorber layer provided on the capping layer and an anti-reflection layer provided on the absorber layer.

6. The apparatus according to claim 5, wherein the absorber layer contains at least one of a nitride of tantalum and a nitride of chromium.

7. The apparatus according to claim 5, wherein the anti-reflection layer contains at least one of an oxide of tantalum and an oxide of chromium.

8. The apparatus according to claim 1, wherein the apparatus is configured to remove a second resist mask used in forming a light blocking region surrounding the pattern region in the absorption layer, the capping layer, and the reflection layer,
the second resist mask is formed by applying a resist onto the absorption layer and onto the exposed capping layer and a desired pattern is drawn.

9. The apparatus according to claim 8, wherein the supply unit is operable to supply ammonia gas and nitrogen gas or only ammonia gas in removing the second resist mask used in forming the light blocking region in the processing chamber.

* * * * *